(12) United States Patent
Nguyen

(10) Patent No.: US 7,425,224 B2
(45) Date of Patent: Sep. 16, 2008

(54) HIGH PRESSURE CHEMICAL VAPOR TRAPPING METHOD

(75) Inventor: Tue Nguyen, Fremont, CA (US)

(73) Assignee: Tegal Corporation, Petaluma, CA (US)

( * ) Notice: Subject to any disclaimer, the term of this patent is extended or adjusted under 35 U.S.C. 154(b) by 351 days.

(21) Appl. No.: 11/318,710

(22) Filed: Dec. 27, 2005

(65) Prior Publication Data

US 2006/0131363 A1    Jun. 22, 2006

Related U.S. Application Data

(63) Continuation of application No. 09/589,636, filed on Jun. 7, 2000, now Pat. No. 6,998,097.

(51) Int. Cl.
*B01D 50/00* (2006.01)

(52) U.S. Cl. .............. 55/309.1; 55/385.2; 55/DIG. 15; 118/715; 62/55.5

(58) Field of Classification Search ............... 55/385.2, 55/DIG. 15, 309, 309.1; 62/55.5; 118/715; 422/168, 169
See application file for complete search history.

(56) References Cited

U.S. PATENT DOCUMENTS

| | | | |
|---|---|---|---|
| 4,468,011 A | 8/1984 | Sikander et al. | 266/149 |
| 5,015,503 A | 5/1991 | Varrin et al. | 117/99 |
| 5,078,851 A | 1/1992 | Nishihata et al. | 204/298.34 |
| 5,240,556 A | 8/1993 | Ishikawa et al. | 216/67 |
| 5,405,445 A | 4/1995 | Kumada et al. | 118/719 |
| 5,819,683 A * | 10/1998 | Ikeda et al. | 118/724 |
| 6,099,649 A * | 8/2000 | Schmitt et al. | 118/715 |
| 6,107,198 A | 8/2000 | Lin et al. | 438/680 |

OTHER PUBLICATIONS

Zorich. B., et al., "Safety and Environmental Concerns of CVD Copper Precursors", Solid State Technology, Sep. 1998, vol. 41, Issue 9, pages.

* cited by examiner

*Primary Examiner*—Robert A Hopkins
(74) *Attorney, Agent, or Firm*—Fliesler Meyer LLP

(57) ABSTRACT

A high pressure trapping system is provided to collect chemical vapor by-products in successive stages through chemical reasons conducted at progressively colder temperatures. A hot trap receives chemical vapor exhaust and collects a first waste, typically a solid, as a result of the high temperature completing a chemical reason in the vapor. Surviving gaseous by-products continue to the next process. The following chamber is colder, and collects waste as a solid or a liquid as a result of a chemical process dependent on the cold temperature. Sometimes a third chamber is used for even a colder chemical reaction to collect waste products. As a solid, these waste products are easier to collect, remove, and even reuse.

9 Claims, 4 Drawing Sheets

HIGH PRESSURE CHEMICAL VAPOR TRAPPING METHOD

CLAIM OF PRIORITY

This application is a continuation of U.S. patent application Ser. No. 09/589,636, filed Jun. 7, 2000 Now U.S. 6,998,097, which is incorporated herein by reference in its entirety.

FIELD OF THE INVENTION

The present invention relates generally to an apparatus for processing of a semiconductor wafer, and, more particularly, to a high pressure trapping system to collect chemical vapor by-products in successive stages through chemical reactions conducted at progressively colder temperatures.

BACKGROUND OF THE INVENTION

Semiconductor processes use vapor precursors for processing thin films on an integrated circuit (IC) substrate. The majority of these vapor precursors, together with their by-products, are pumping out and exhausted to a waste stream.

It is very expensive to collect and dispose of the precursor exhaust products. Further, these non-reactive precursors and these byproducts can be hazardous and harmful to the environment. The IC industry is forced to conform to ever more stringent regulations concerning the storage and disposal of these wastes.

It is inconvenient to collect waste as a gas because it is difficult to transport and voluminous to store. It is more convenient to convert the waste, at least partially, into a solid or liquid form. The use of cold traps to completely condense some chemical vapors is well known. It is also well known to use cold traps to condense elements of a precursor at least to simplify the waste collection process.

In a chemical vapor deposition (CVD) process, high temperature process is often used. Because of the low efficiency of the CVD process, a hot trap is recommended for completing the CVD reaction, leaving only the by-products to the exhaust stream. An example is a copper CVD process. A copper CVD process uses copper-hfac-tmvs precursor to deposit copper on a hot surface (~200° C.) following the reaction:

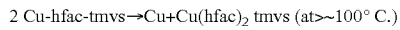

2 Cu-hfac-tmvs→Cu+Cu(hfac)$_2$ tmvs (at>~100° C.)

The reaction occurs at a temperature higher than ~100° C. The efficiency of this reaction is roughly 10-20%; thus, 80-90% of the precursor leaves the process chamber unreacted. A cold trap would then collect the precursor Cu-hfac-tmvs, and the by-products Cu(hfac)$_2$ and tmvs. Using a hot trap before the cold trap, most of the precursor would further react, leaving only the by-products in the waste system.

FIG. 1 shows a prior art apparatus for such a recovery and abatement of CVD copper process. Precursor exhaust leaves the process chamber 10, encounters the hot trap 20 to further reaction. The vacuum pump 30 them pumps away the precursor exhaust. The exhaust then encounters the cold trap 40 to trap all precursor by-products when then drop into the drain 45. The vacuum pump is located after the hot trap to avoid deposition inside the pump, thus, prolonging the pump life.

The major disadvantage of this prior art, is the potential contamination of the process chamber due to the hot trap. With the hot trap raising the efficiency from 10-20% to 100%, the amount of by-products Cu(hfac)$_2$ and tmvs, 3-5 times. Also, the efficiency of the hot trap is low because of the low pressure inside the hot trap, and the hot and cold traps would be two separate units. However, the prior art recommends using this configuration to avoid damage to the vacuum pump.

It would be advantageous if hot and cold traps could be combined in a single system to collect different types of wastes from an exhausted chemical vapor.

It would be advantageous if a multi-state trapping system could be provided that operated at a high pressure so that the chemical reactions in the traps are efficient.

SUMMARY OF THE INVENTION

Accordingly, a high pressure chemical vapor trapping system to separate and collect elements of a chemical vapor exhaust is provided. The system comprises a hot trap and a cold trap connected to each other as a single unit. The exhaust pump is upstream of the hot and cold trapping system, providing high pressure in the hot trap. While prior art positions the hot trap upstream of the exhaust pump to avoid damage to the pump, it was found that there was no significant damage to the exhaust pump by having the pump connected directly to the process chamber. The reason is that the pump temperature is much lower than most process temperatures, and most processes require a high temperature for deposition; thus, there is minimum deposition at the pump. With use of a wet pump, the only side effect is the faster degradation of the pump oil, thus needing a more frequent oil changing schedule. However, the use of a dry pump, which uses no oil, positioning the pump upstream of the hot and cold trapping system has no effect on the pump. Since a dry pump typically runs at less than ~70° C., and a wet pump runs at room temperature, and since deposition processes run at much higher temperatures, e.g., typically 200° C. for MOCVD copper deposition; 400-500° C. for PECVD deposition; and 1000-1100° C. for rapid thermal deposition, the prior art concern about significant deposition at the pump, leading to degradation of the pump, is not a concern using this invention.

The present invention system comprises a hot trap having an input port, a gas output port, a waste collection surface, and a heater. The heater heats the hot trap to a temperature in the range from 100 to 500 degrees Celsius. The hot trap accepts chemical vapor such as the above-described copper precursors and provides non-gaseous wastes at the waste collection surface, and gaseous exhaust at the gas output port at a pressure substantially the same as the input pressure.

The system also comprises a cold trap having an input port operatively connected to the gas output port of the hot trap, a gas output port, and a waste collection surface. The cold trap cools the chamber to a temperature in the range from 25 degrees to minus 200 degrees Celsius. The cold trap provides non-gaseous wastes at the waste collection surface, and gaseous exhaust at the gas output port at a pressure substantially the same as the input pressure. In this manner, vapor by-products are collected in two stages.

The invention further provides that an exhaust pump, operatively connected to a hot trap input port, provides gaseous exhaust to the hot trap. In this manner, a high pressure is created at the hot trap gas input port.

The invention further provides a second cold trap. The second cold trap, set to be colder than the first cold trap, can trap the exhaust gas that has a lower temperature. In this manner, vapor by-products are collected in three stages. In the example of Cu-hfac-tmvs, the first cold trap is set at a temperature below room temperature to trap the by-product Cu(hfac)$_2$. The second cold trap is set at a lower temperature (~-40° C.) to trap the other by-product tmvs.

In some aspects of the invention, the chemical vapor exhaust is an MOCVD precursor such as Cu(hfac) combined with a ligand (Cu(hfac)L). Then, the first chamber includes a plurality of metal plates, or other heated structures extending into the hot trap. These metal plates are of the same metal as in the MOCVD precursor and act as metal collection surfaces. That is, the collection surface acts as the heater in the hot trap. As the precursor vapor is heated, metal from the precursor is deposited on the metal plates as the heat completes the chemical reaction. The metal collection surface/heaters are reclaimed from recycling when a predetermined amount of solid metal waste is collected on the collection surfaces.

In some aspects of the invention, both the hot and cold traps are easily removable for efficient recycling of the collected waste materials. A first exhaust line extends to the exhaust input port of the hot trap. The first line includes at least one valve to block the passage of gas from the deposition process chamber. Likewise, a second exhaust line extends from the hot trap gaseous exhaust port, and also includes at least one valve to block the escape of gas from the second line.

The hot trap includes a first valve at the exhaust input port and a second valve at the gaseous exhaust port. The hot trap is removable from the first and second lines for waste removal, when full. In this manner, the first and second valves in said hot trap prevent exhaust from escaping from the trap, when the trap is disconnected. The valves in the first and second lines prevent the escape of exhaust from the system when the hot trap is removed. In the same manner values are used in the gas lines going to and from the cold trap, they are also used in the input and output gas ports. Then, the cold trap is also easily removable without allowing the escape of vapors from the system.

Sometimes the hot trap collection surfaces are biased with a voltage, whereby charged metal from the MOCVD precursor is attracted and deposited on said collection surface. In other aspects of the invention, the hot trap includes a second input port to accept a catalyst selected from the group consisting of water, alcohol, and ammonia whereby the catalyst furthers the chemical reaction in the first chamber.

DETAILED DESCRIPTION OF THE PREFERRED EMBODIMENT

Figure 1:
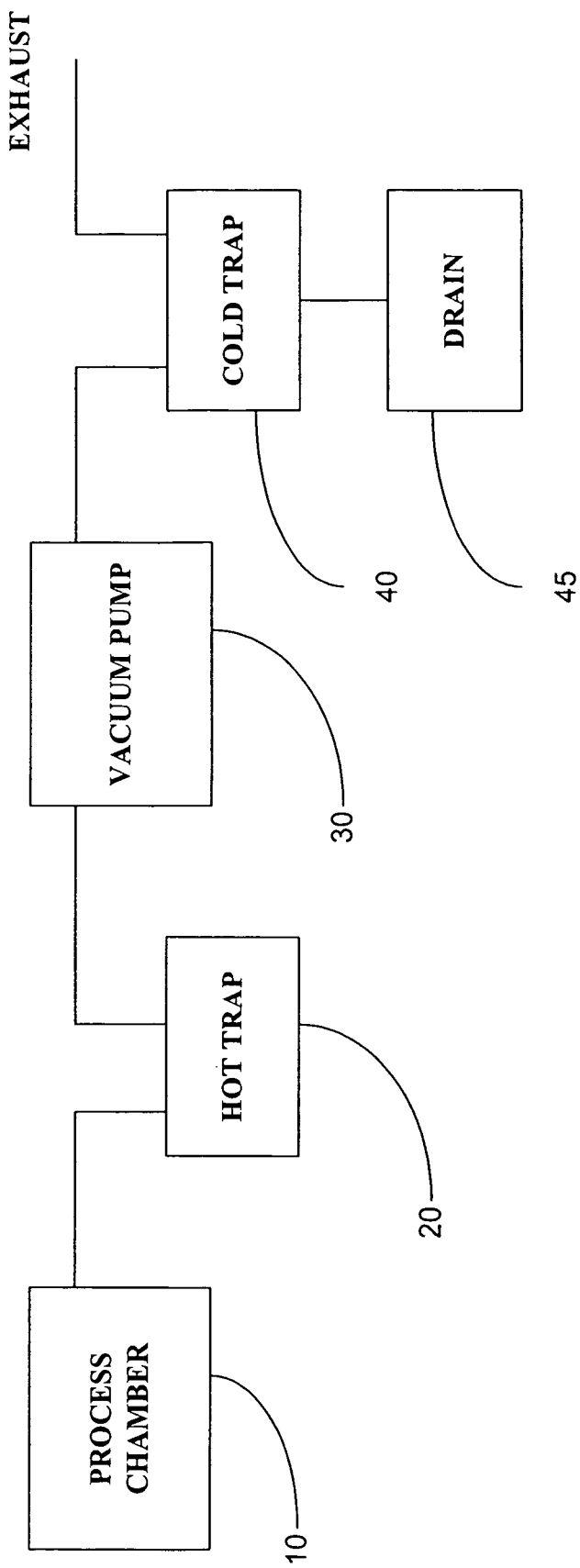
FIG. 1 shows a prior art trapping system.
Figure 2:
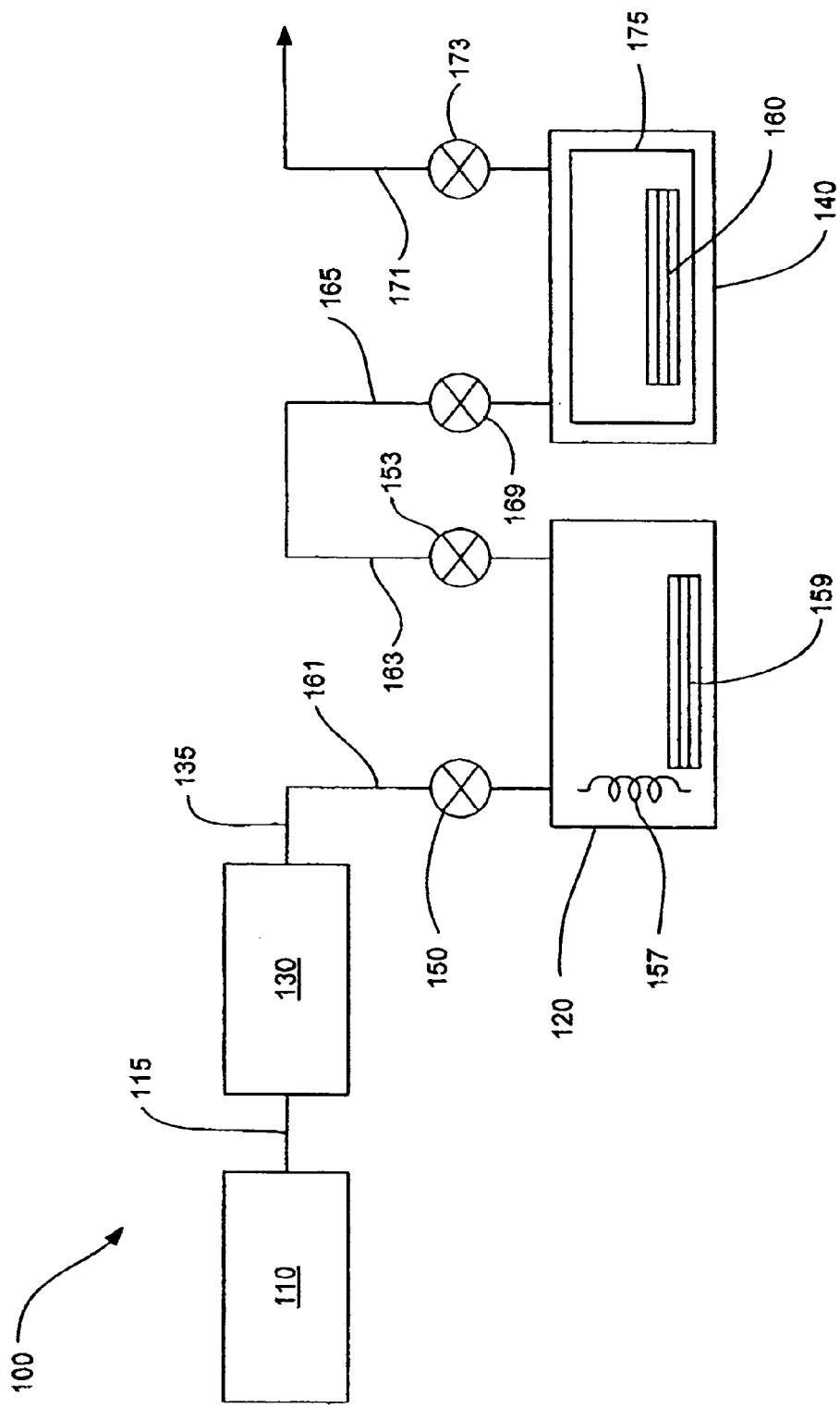
FIG. 2 shows the present invention of the high pressure chemical vapor trapping system.

FIG. 2 shows the present invention high pressure chemical vapor trapping system. The exhaust from the processing chamber 110 is pumped away by the vacuum pump 130. The pressure in the process chamber foreline 115 is normally low, in the range of torr or millitorr pressure. After the vacuum pump, the pressure is almost atmospheric at the vacuum pump exhaust 135. The hot trap converts un-reacted precursors to the precursor by-products, and the cold trap 140 converts the gas phase by-products to non-gaseous phase by-products for easy transport and storage. The present invention connects to the downstream of the vacuum pump to take advantage of the high pressure at the pump exhaust. By not disturbing the chamber configuration, there is no potential contamination of the process.

In particular, FIG. 2 shows a processing chamber 110 connected by a process chamber foreline 115 to a vacuum pump 130. The vacuum pump 130 can be a wet pump that uses oil, or a dry pump. As discussed above, both types of pumps operate at temperatures well-below any range of temperature that might result in damaging deposition of the pump. The vacuum pump 130 exhausts through exhaust line 135, which is connected with an input port 161 for a hot trap 120. The vacuum pump creates high pressure at the hot trap input port 161. The input port 161 of the hot trap 120 has a first valve 150 to prevent exhaust from escaping when the hot trap is disconnected for cleaning or other purposes. The hot trap 120 also has an output port 163 having a second valve 153 which is also used to prevent exhaust from escaping from the hot trap 120 when the hot trap is disconnected from the system 100 for cleaning or other purposes.

The hot trap 120 may also contain a plurality of collection surfaces 159 extending into the hot trap 120. These collection surfaces 159 can be heated by a chamber heater 157 to the temperature of the hot trap 120, generally ranging from 100° C.-500° C. The chamber heater 157 is depicted generically as a coil in the drawings, but the chamber heater 157 need not be an isolated element. Without limitation and by way of example only, the chamber heater alternatively can be associated with the collection surfaces 159 or it can be part of the chamber itself. The collection surfaces 159 collect deposited solid metal waste, which can be reclaimed from the collection surfaces 159 when the hot trap 120 is disconnected to be cleaned.

Figure 3:
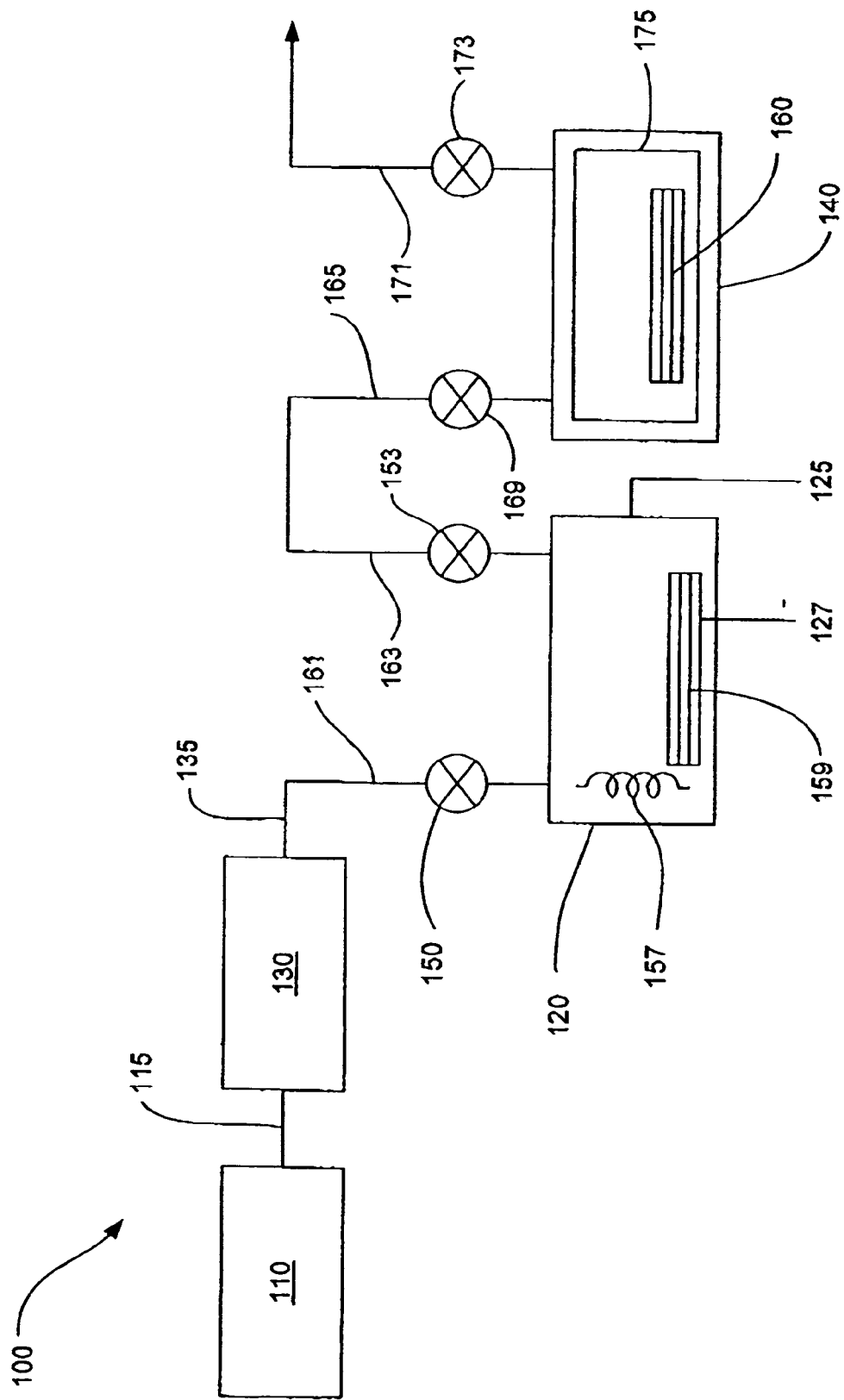
FIG. 3 shows another aspect of the present invention of the high pressure chemical vapor trapping system.

Moreover, in another aspect of the invention depicted in FIG. 3, the hot trap 120 can be biased with a negative voltage 127 to attract positively charged metal from, e.g., an MOCVD precursor to the collection surfaces 159. Alternatively, the hot trap 120 can be biased with a positive voltage to attract negatively charged metal from an MOCVD precursor to deposit on the collection surfaces 159. The bias is added to the hot trap in order to accelerate the deposition process and improve hot trap efficiency. In yet another aspect of the invention, the hot trap 120 can be connected with a catalyst inlet 125 to accelerate the deposition process and thereby improve the efficiency of the hot trap 120. The other elements depicted in FIG. 3 are essentially the same as the elements in FIG. 2.

In both FIGS. 2 and 3, the output port 163 of the hot trap 120 is operatively connected with the input port 165 of a cold trap 140 located downstream of the hot trap 120. The cold trap accepts chemical vapors from the hot trap via the cold trap input port 165 and cools the vapor with a cooler 175 to a temperature lower than the temperature of the hot trap 120. The cooler 175 can be either part of the cold trap chamber itself, or it can be associated with waste collection surfaces 160. The temperature in the cold trap 140 in one embodiment can be 25° C. to negative 200° C. As by-products exhausted from the hot trap 120 are cooled, they deposit as solid waste on a waste collection surfaces 160 in the cold trap 140. Remaining vapor is exhausted through an output port 171 of the cold trap 140.

Similar to the hot trap 120, the cold trap 140 can be disconnected from the system 100 for cleaning solid waste without allowing vapor to escape. Disconnection of the cold trap 140 is accomplished with the input port valve 169 and output port valve 173 of the cold trap 140. Once chemical vapors are exhausted from the output port 171 of the cold trap 140, they are exhausted out of the system 100.

Figure 4:
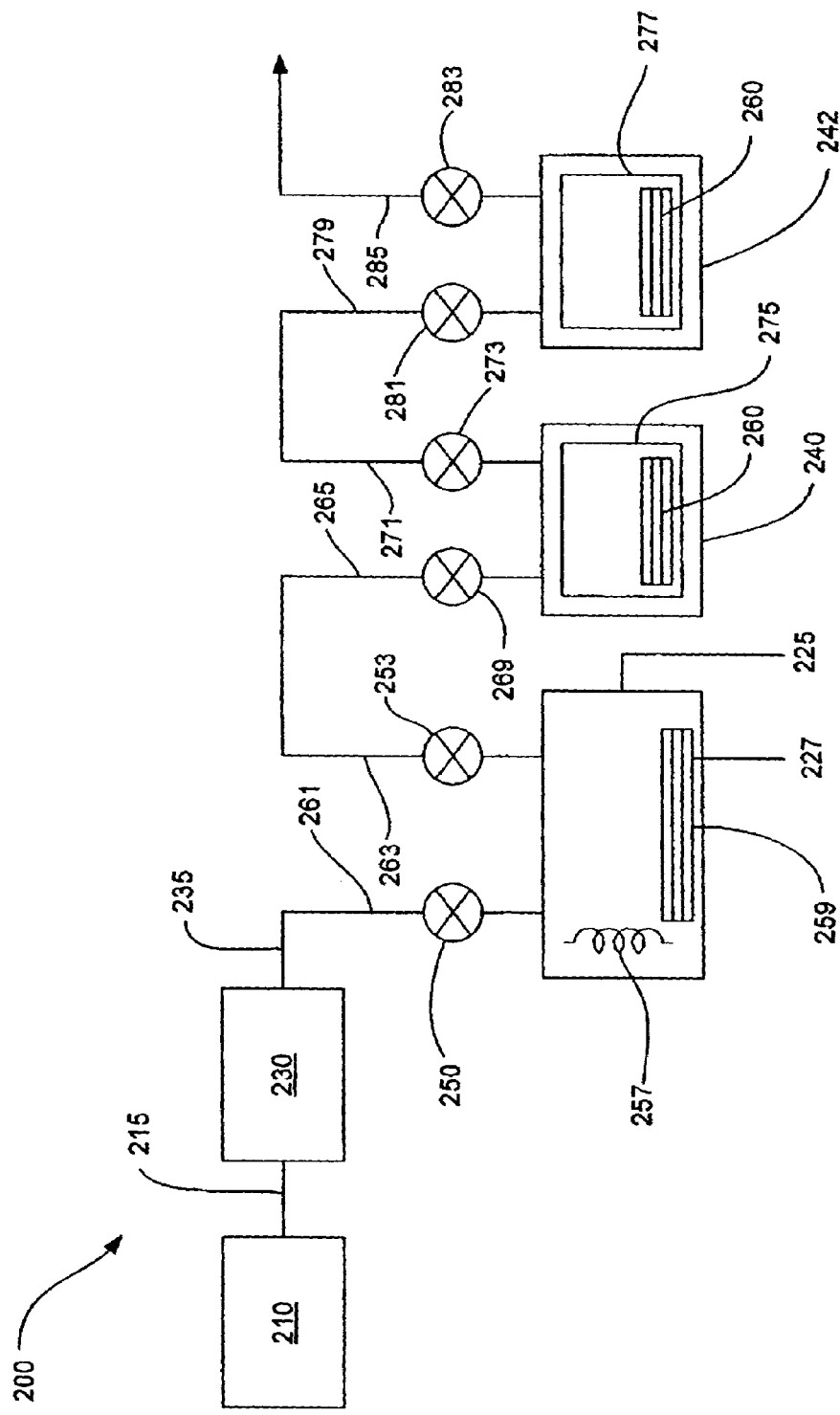
FIG. 4 shows another aspect of the present invention of the high pressure chemical vapor trapping system.

In an alternative embodiment 200 (FIG. 4), the vapor exhaust is forwarded through the output 271 of the cold trap 240 to a second cold trap 242, located downstream of the first cold trap 240, and which is maintained at a lower temperature than the first cold trap 240 with a cooler 277. The elements upstream of the second cold trap are essentially the same as those depicted in FIGS. 2 and 3, with the exception as noted above, that the vapor exhaust is not exhausted out of the system, but rather, through the second cold trap. Elements in FIG. 4 that are similar to the elements in FIG. 3 have the same number in FIG. 4 as they do in FIG. 3, but in the 200 series of numbers. The second cold trap 242 accepts chemical vapor exhaust through an input port 279 of the second cold trap 242, which is connected with the output port of the first cold trap 240. The lower temperature of the second cold trap 242 relative to the first cold trap 240 results in further deposition of solid waste at collection plates 260 in the second cold trap 242. Remaining chemical vapor is exhausted through an output port 285 of the second cold trap 242 and out of the system 200. Similar to the first cold trap 240, the second cold trap 242 can be disconnected from the system 200, for cleaning or other purposes, without release of chemical vapors by closing input valve 281 and output valve 283.

The present invention discloses the use of the hot trap after the vacuum pump without any observable degradation to the vacuum pump, and without any contamination to the process chamber.

While the invention has been particularly shown and described with reference to the preferred and alternative embodiments described above, it will be understood by persons skilled in the relevant art that various changes in form and details can be made therein without departing from the spirit and scope of the invention.

What is claimed is:

1. A method to separate and collect elements of a chemical vapor exhaust at a high pressure, the method comprising:
   (a) passing sequentially the exhaust from a processing chamber to a vacuum pump and to a hot trap, and then to a first cold trap, wherein a non-gaseous chemical waste is collected in the hot trap and in the first cold trap, and a gaseous exhaust is thereafter vented;
   (b) collecting any additional non-gaseous waste in a second cold trap before the gaseous exhaust is vented, the second cold trap operatively connected with and positioned downstream of the first cold trap.

2. A method as in claim 1 wherein the chemical vapor exhaust is a MOCVD precursor exhaust, in which the passing of the exhaust through the hot trap collects a solid metal waste from the MOCVD precursor exhaust.

3. A method as in claim 1 further comprising biasing the hot trap with a voltage before passing the exhaust through the hot trap, whereby charged metal from the MOCVD precursor is attracted to and deposited in the hot trap.

4. A method as in claim 1 further comprising bypassing the hot trap to allow the disconnection of the hot trap without exposing the exhaust to the hot trap.

5. A method as in claim 1 further comprising bypassing the first cold trap to allow the disconnection of the first cold trap without exposing the exhaust to the first cold trap.

6. A method as in claim 1 further comprising bypassing the second cold trap to allow the disconnection of the second cold trap without exposing the exhaust to the second cold trap.

7. A method as in claim 1 further comprising heating the hot trap to a hot trap temperature before passing the exhaust through the hot trap.

8. A method as in claim 1 further comprising cooling the first cold trap to a first cold trap temperature before passing the exhaust through the first cold trap.

9. A method as in claim 1 further comprising cooling the second cold trap to a second cold trap temperature before passing the exhaust through the second cold trap.

* * * * *